_(12)_ United States Patent
Bourdelle et al.

(10) Patent No.: US 7,670,929 B2
(45) Date of Patent: Mar. 2, 2010

(54) METHOD FOR DIRECT BONDING TWO SEMICONDUCTOR SUBSTRATES

(75) Inventors: Konstantin Bourdelle, Crolle (FR); Carlos Mazure, Bernin (FR); Olivier Rayssac, Grenoble (FR); Pierre Rayssac, legal representative, Clairvaux d'Aveyron (FR); Gisèle Rayssac, legal representative, Clairvaux d'Aveyron (FR)

(73) Assignee: S.O.I. Tec Silicon on Insulator Technologies, Bernin (FR)

( * ) Notice: Subject to any disclaimer, the term of this patent is extended or adjusted under 35 U.S.C. 154(b) by 143 days.

(21) Appl. No.: 11/624,070

(22) Filed: Jan. 17, 2007

(65) Prior Publication Data

US 2008/0014712 A1 Jan. 17, 2008

(30) Foreign Application Priority Data

Jul. 11, 2006 (FR) .................................. 06 06311

(51) Int. Cl.
*H01L 21/30* (2006.01)
(52) U.S. Cl. ............................. 438/455; 257/E21.088
(58) Field of Classification Search ................ 438/455, 438/458, 459, 756; 134/1.2, 1.3, 902
See application file for complete search history.

(56) References Cited

U.S. PATENT DOCUMENTS

| | | | |
|---|---|---|---|
| 4,878,957 A | 11/1989 | Yamaguchi et al. | 148/33.3 |
| 5,421,953 A | 6/1995 | Nagakubo et al. | 216/34 |
| 5,451,547 A | 9/1995 | Himi et al. | 437/225 |
| 5,603,779 A * | 2/1997 | Linn et al. | 438/455 |
| 6,010,579 A | 1/2000 | Henley et al. | 148/33.2 |
| 6,048,411 A | 4/2000 | Henley et al. | 148/33.5 |
| 6,146,979 A | 11/2000 | Henley et al. | 438/458 |
| 6,251,754 B1 | 6/2001 | Ohshima et al. | 438/506 |
| 6,323,108 B1 | 11/2001 | Kub et al. | 438/458 |
| 6,461,939 B1 | 10/2002 | Furihata et al. | 438/459 |
| 6,500,732 B1 | 12/2002 | Henley et al. | 438/459 |
| 6,534,380 B1 | 3/2003 | Yamauchi et al. | 438/455 |
| 6,534,412 B1 * | 3/2003 | Lin | 438/706 |

(Continued)

FOREIGN PATENT DOCUMENTS

EP    0 335 741 B1    8/1995

(Continued)

OTHER PUBLICATIONS

Mitani et al, "Causes and Prevention of Temperature-Dependent Bubbles in Silicon Wafer Bonding", Apr. 4, 1991, Japanese Journal of Applied Physics, vol. 30, No. 4, pp. 615-622.*

(Continued)

*Primary Examiner*—David Vu
*Assistant Examiner*—Suberr Chi
(74) *Attorney, Agent, or Firm*—Winston & Strawn LLP

(57) ABSTRACT

The invention provides methods of direct bonding substrates at least one of which includes a layer of semiconductor material that extends over its front face or in the proximity thereof. The provided methods include, prior to bonding, subjecting the bonding face of at least one substrate comprising a semiconductor material to selected heat treatment at a selected temperature and in a selected gaseous atmosphere. The bonded substrates are useful for electronic, optic, or optoelectronic applications.

18 Claims, 4 Drawing Sheets

U.S. PATENT DOCUMENTS

| | | | |
|---|---|---|---|
| 6,696,352 B1 | 2/2004 | Carr et al. | 438/458 |
| 6,806,171 B1 | 10/2004 | Ulyashin et al. | 438/492 |
| 7,056,815 B1 | 6/2006 | Weng et al. | 438/518 |
| 7,396,734 B2 | 7/2008 | Moriwaki | 438/406 |
| 2001/0041423 A1 | 11/2001 | Nishida et al. | 438/455 |
| 2002/0113265 A1 | 8/2002 | Falster | 257/347 |
| 2002/0187619 A1 | 12/2002 | Kleinhenz et al. | 438/471 |
| 2003/0153163 A1 | 8/2003 | Letertre et al. | 438/458 |
| 2004/0241959 A1* | 12/2004 | Letertre et al. | 438/455 |
| 2006/0208341 A1 | 9/2006 | Atwater, Jr. et al. | 257/616 |

FOREIGN PATENT DOCUMENTS

| | | |
|---|---|---|
| EP | 1 100 127 A1 | 5/2001 |
| EP | 1324385 A2 | 7/2003 |
| KR | 1998-021103 | 6/1998 |
| KR | 20020090760 | 12/2002 |

OTHER PUBLICATIONS

Q.Y. Tong et al, "Hydrophobic Silicon Wafer Bonding", Jan. 31, 1994, Applied Physics Letters, vol. 64, No. 5, pp. 625-627.*

G. K. Celler et al., ,"Frontiers of Silicon-on-insulator", Journal of Applied Physics, vol. 93, No. 9, pp. 4955-4978 (2003).

Y. Bäcklünd et al., "Bond-strength measurements related to silicon surface hydrophilicity", J. Electrochem. Soc., vol. 139 No. 8, pp. 2299-2301 (1992).

R. Esser, et al., "Improved low temperature Si-Si hydrophilic bonding techniques", Journal of the Electrochemical Society, vol. 2001-27, pp. 126-135.

L. Holl et al., "UV activation treatment for hydrophobic wafer bonding", Journal of the Electrochemical Society, vol. 153 (7), G613-G616 (2006).

R.D. Horning et al., "Wafer-to-wafer bond characterization by defect decoration etching", pp. 199-206.

M.J. Kim et al., "Heterogeneous silicon integration by ultra-high vacuum wafer bonding", Journal of Electrochemical Materials, vol. 32, No. 8, pp. 849-854 (2003).

K.L. Saenger et al. "Amorphization/templated recrystallization mehod for changing the orientation of single-crystal silicon: an alternative approach to hybrid orientation substrates", Applied Physics Letters, vol. 87, pp. 221911-1-221911-3 (2005).

C.Y. Sung et al. "High performance CMOS bulk technology using direct silicon bond (DSB) mixed crystal orientation substrates", Tech. Dig.—Int. Electron Devices Meet., 2005, 236.

Q.Y. Tong et al., "Semiconductor wafer bonding science and technology", published by John Wiley & Sons, New York pp. 1-99 (1999).

Colinge, J. P., "Silicon-On-Insulator Technology", Materials to VLSI, 2nd Edition, pp. 50-51 (1997).

C. Maliville et al., "Detailed characterization of Wafer Bonding Mechanisms", Electrochemical society Proceedings, vol. 97-36, pp. 46-55 (1997).

International Search Report PCT/IB2008/000567 dated Oct. 14, 2008.

Qin-Yi Tong et al., "Low Temperature Wafer Direct Bonding", Journal Of Microelectromechanical Systems, vol. 3, No. 1, pp. 29-35 (1994).

Taekryong Chung et al.: "InGaAsP Lasers On GaAs Fabricated By The Surface Activated Wafer Direct Bonding Method At Room Temperature", Japanese Journal of Applied Physics, vol. 37, No. 3B, pp. 1405-1407 (1998).

Office Action from KIPO dated May 26, 2009.

Taekryong Chung et al.: "1.3 µm InGaAsP/InP Lasers On GaAs Substrate Fabricated By The Surface Activated Wafer Direct Bonding Method At Room Temperature", Applied Physics Letters, vol. 72, No. 13, pp. 1565-1566 (1998).

* cited by examiner

METHOD FOR DIRECT BONDING TWO SEMICONDUCTOR SUBSTRATES

FIELD OF THE INVENTION

The present invention relates to methods for fabricating a hybrid substrate for use in electronics, optics, or optoelectronics. In particular, the invention provides methods for direct bonding of two substrates, i.e. molecular bonding without any intermediate layer such as a layer of adhesive, which can be implemented during the fabrication of hybrid substrates.

BACKGROUND OF THE INVENTION

Various known methods for fabricating hybrid substrates include steps for bonding donor substrates onto receiver substrates and then for removing a remainder portion of the donor substrate in order leave a transfer layer portion of the donor substrate bonded to the receiver substrate. To improve bonding, an intermediate layer (a bonding layer) is often formed between the donor and receiver substrates. A resulting hybrid substrate then comprises in succession the transfer layer having thicknesses typically between 0.01 micrometers (µm) and a few µm, an intermediate having thicknesses typically between 0.01 µm and 1 µm; and the receiver substrate having thickness typically of several hundreds of µm.

Techniques for removing the remainder (or rear) portion of the donor substrate include grinding and/or chemical etching. Further techniques include, prior to bonding, forming a zone of weakness inside the donor substrate, then removing the remainder portion of the donor substrate by fracturing along the zone of weakness. The zone of weakness can be formed by implanting atomic species, such as hydrogen and/or rare gases, according to techniques known under the trademark of SMART-CUT®. The zone of weakness can also be formed by creating a porous zone according to techniques known under the trademark of ELTRAN®. See, e.g., Celler et al., 2003, Frontiers of Silicon-on-insulator, *J. App. Physics* 93:4955-4978.

Semiconductor-on-insulator (SeOI) substrates, especially silicon-on-insulator (SOI) substrates, can be fabricated by such known methods. During fabrication, an insulating layer is formed on the face of one or both substrates (by, e.g., thermal oxidation or oxide deposition) and it the also serves as a bonding layer when the substrate faces are put together during the bonding step. In the final hybrid substrate, the insulating layer is buried. In such layer transfer techniques, the quality of the resulting hybrid substrate directly depends on the quality of the bonding. A high bonding energy, this is the energy with which two substrates are bonded together, is important during the subsequent step of removing the remainder portion of the donor substrate. Bond energy and bond quality are known to be determined by properties of the substrate bonding surfaces, e.g., by planeness, by particles contaminants, by roughness, and by hydrophilicity.

Bond energy and quality are known to be improved by an intermediate layer (a bonding layer) with sufficient thickness, i.e. greater than 50 nanometers (nm), between two bonding faces of the two substrates. In particular, the bond quality is improved because there are fewer bond defects, e.g. blisters. See, e.g., Q. Y. Tong and U. Gösele, *Semiconductor wafer bonding science and technology*, published by John Wiley & Sons, New York (1999). Thus, the buried insulating layer in SeOI type substrates can serve both to insulate, to facilitate bonding, and to limit bonding defects.

However, in certain applications, any buried insulating layer should be at least limited to thicknesses less than about 50 nm or preferably even eliminated. Such application include those in which a high heat conduction between the transferred layer (in which microelectronic components can be formed) and the receiver substrate is advantageous. Bonding without a buried insulating layer (i.e. direct bonding) can also be advantageous in applications needing improved electrical conduction between the transfer layer and the receiver substrate. Additionally, it can also be advantageous to direct bond a receiver substrate of silicon covered and a transfer layer that is elastically stressed in tension or in compression, e.g., a layer of strained silicon, or of germanium, or of silicon-germanium Further, direct bonding can also be advantageous in applications in which the transfer layer and the receiver substrate have different crystal orientations. For example, in complementary metal oxide semiconductor (CMOS) type components, NMOS elements can be fabricated in a (100) silicon layer, while PMOS elements can be fabricated in a (110) silicon layer. See, e.g., K. L. Saenger et al. "Amorphization/templated recrystallization method for changing the orientation of single-crystal silicon: an alternative approach to hybrid orientation substrates", *Appl. Phys. Lett.*, 87, 221911 (2005), and C. Y. Sung et al. "High performance CMOS bulk technology using direct silicon bond (DSB) mixed crystal orientation substrates", *Tech. Dig.—Int. Electron Devices Meet.*, 2005, 236.

Direct bonding techniques are known and include hydrophilic bonding and hydrophobic bonding techniques. Hydrophilic bonding of silicon to silicon includes, prior to placing the substrate bonding surface into intimate contact, hydrophilic cleaning of the bonding surfaces. Hydrophilic cleaning is typically performed by the "RCA" method during which the bonding surfaces are exposed first to standard clean 1 (SC1) solution and then first to standard clean 2 (SC2) solution. SC1 solution comprises a mixture of ammonium hydroxide ($NH_4OH$), hydrogen peroxide ($H_2O_2$), and deionized water; SC2 solution comprises a mixture of hydrochloric acid (HCl), hydrogen peroxide ($H_2O_2$), and deionized water. See, e.g., C. Maleville, O. Rayssac, H. Moriceau et al., in *Proc. 4th Internat. Symposium on Semiconductor Wafer Bonding*: PV97-36, ECS publications, p. 46, 1997.

Hydrophobic bonding of silicon to silicon includes, prior to placing the substrate bonding surfaces into intimate contact, hydrophobic cleaning of the bonding surfaces. Hydrophobic cleaning is typically performed by exposing the bonding surface to a bath of hydrofluoric acid (HF) (known in the art as "HF last" cleaning), or cleaning in HF vapor, or annealing in an ultra-high vacuum (UHV). In the HF last cleaning technique, exposure to a HF bath is usually followed by rather complex rinsing and drying steps. Further, because the surfaces then become reactive to metallic and particle contaminants, special precautions are advantageous to avoid such contamination. See, e.g., M. J. Kim and R. W. Carpenter, "Heterogeneous silicon integration by ultra-high vacuum wafer bonding", *Journal of Electrochemical Materials*, Vol. 32, No. 8, 2003.

However, for the following reasons, it has been difficult to achieve sufficient bond quality in routine commercial or industrial application of known direct bonding techniques such as hydrophilic or hydrophobic bonding. See, e.g., S. L. Holl et al., "UV activation treatment for hydrophobic wafer bonding", *Journal of the Electrochemical Society*, 153 (7), G613-G616 (2006). Hydrophobic bonding using the HF last cleaning technique is rather complex and prone to contamination. UHV annealing requires the use of expensive equipment. Further, to achieve bond strength, both hydrophilic and hydrophobic cleaning techniques are advantageously followed by thermal annealing in the range 200° C. to 1200° C. for a few, e.g. 2, hours (h). But annealing at high temperatures may not be possible for certain subsequent applications. It may even not be advantageous to exceed 200° C.

Also, after annealing in the range 200° C. to 1100° C., bubbles have been observed in both hydrophilic or hydrophobic bonding interfaces by infrared transmission techniques. Such bubbles may be due to desorption of species remaining at the bonding surfaces regardless of the cleaning technique. And, after annealing in the range 1100° C. to 1200° C., bond defects are known to exist even though infrared-visible bubbles are rate or absent. These defects may be observable by the acoustic microscopy technique. See, e.g., R. D. Horning and R. R. Martin, "Wafer-to-wafer bond characterization by defect decoration etching", *Second International Symposium on Semiconductor Wafer Bonding: Science Technology and Applications*, PV93-29, p 199, 1993.

Methods known for obviating defects observed after direct bonding include, for example, creating trenches to promote escape of desorbed gases or performing a desorption step prior to bonding. However, such methods are not fully satisfactory and are not always suitable if certain types of electronic components are to be fabricated. See, e.g., R. H. Esser, K. D. Hobart, and F. J. Kub, "Improved low temperature Si—Si hydrophilic wafer bonding", *Journal of the Electrochemical Society*, 150(3), G228-G231 (2003).

Thus, improvements over these prior art techniques are needed.

SUMMARY OF THE INVENTION

The invention seeks to remedy the above-mentioned drawbacks of the prior art by providing methods enabling two substrates to be bonded directly one against the other without any additional bonding layer, where at least one of the substrates comprises a layer of semiconductor material on one of its faces or in the proximity thereof, and for this to be done with quality that is satisfactory and without macroscopic bonding defects such as bubbles appearing. In particular, the invention relates to methods of direct bonding of so "front" (or bonding) faces of two substrates for use in applications in the fields of electronics, optics, or optoelectronics. Preferably, at least one of the two substrates, which is referred to as the "substrate comprising a semiconductor", comprises a layer of semiconductor material that extends over its front face or in the proximity thereof.

These methods make possible the elimination of the native oxide present on the treated surface and also make possible the passivation of the surface by means of hydrogen atoms. Contrary to the state of the art, the method can be used with good results, even if the substrates do not have an insulating layer, or if they do have an insulating layer, it has a thickness of less than about 50 nm. In addition, the preparation treatment prior to bonding makes it possible to obtain very low levels of roughness. It has been possible to measure root mean square (rms) roughness of 0.7 angstroms (Å) on a scanned 2 μm by 2 μm sample, whereas the surface of a silicon substrate typically presents rms roughness of the order of 2 Å. The usual surface preparation treatments prior to bonding (such as SC1 type cleaning) tend to make the surface even rougher. The invention thus presents the additional advantage of putting into contact surfaces that present very little roughness.

In preferred embodiments, the provided methods comprise the steps of subjecting at least the front face of the substrate that comprises a semiconductor, or at least one of the front faces of both substrates if both substrates comprise a semiconductor, to heat treatment referred to as "preparation treatment prior to bonding", at a temperature lying in the range 900° C. to 1200° C., in a gaseous atmosphere comprising hydrogen and/or argon, for a duration of at least 30 seconds (s); and then bonding directly together the respective front faces of the two substrates.

Advantageous and non-limiting aspects of the invention include, singly or in combination, that the preparation treatment prior to bonding is performed in a gaseous atmosphere containing argon exclusively or containing hydrogen exclusively; and that the preparation treatment prior to bonding is performed in a rapid thermal annealing (RTA) type chamber or in a conventional chamber or in an epitaxy chamber; and that the direct bonding is performed immediately after the preparation treatment prior to bonding; and that the substrate (s) subjected to the preparation treatment prior to bonding is/are stored temporarily in a chamber under a controlled inert gas atmosphere prior to direct bonding; and that after direct bonding, a bonding consolidation heat treatment is performed at a temperature lying in the range 200° C. to 1200° C., for about at least one hour and preferably for less than three hours; and that both substrates for bonding comprise a semiconductor, and the front faces of the both substrates are subjected to the preparation treatment prior to bonding; and that the semiconductor material is selected from (100) silicon, (110) silicon, and (111) silicon.

In further preferred embodiments, the provided methods include the steps of selecting a "receiver" substrate having one of its faces referred to as a "front" (or bonding) face; selecting a "donor" substrate that comprises a layer of material for transfer, and another portion referred to as the "remainder", the layer for transfer extending over one of the faces of the donor substrate, referred to as its "front" face, where at least one of the receiver and donor substrates comprising a layer of semiconductor material extending over its front face or in the proximity thereof; proceeding with the above described preparation and direct bonding steps of the two respective front faces of the donor substrate and of the receiver substrate; and removing the remainder from the donor substrate in order to obtain the hybrid substrate comprising the receiver substrate and the transferred layer.

Further advantageous and non-limiting aspects of the invention include, singly or in combination, that at least one of the donor and receiver substrates comprises a layer of insulating material on the layer of semiconductor material; and that layer of insulating material extends over the front face of the substrate; and that the layer of insulating material has a thickness less than or equal to about 50 nm; and that the layer of insulating material is a layer of native oxide; and that the remainder of the donor substrate is removed by mechanical and/or chemical thinning; and that prior to the direct bonding, a zone of weakness is formed inside the donor substrate, and at least a portion of the remainder of the donor substrate is removed along the zone of weakness by applying mechanical, chemical, and/or thermal stresses; and that the zone of weakness is formed by implanting atomic species; and that if the receiver substrate comprises a layer of semiconductor material, only the receiver substrate is subjected to the preparation treatment prior to bonding; and that the zone of weakness is a porous zone.

Other characteristics and advantages of the invention appear from the following description given with reference to the accompanying drawings which show one possible implementation by way of non-limiting indication. Further aspects and details and alternate combinations of the elements of this invention that are apparent from the following detailed description and are also within the scope of the present invention.

BRIEF DESCRIPTION OF THE DRAWINGS

The present invention may be understood more fully by reference to the following detailed description of the preferred embodiment of the present invention, illustrative examples of specific embodiments of the invention and the appended figures in which.

DETAIL DESCRIPTION OF THE PREFERRED EMBODIMENTS

Figure 1A:
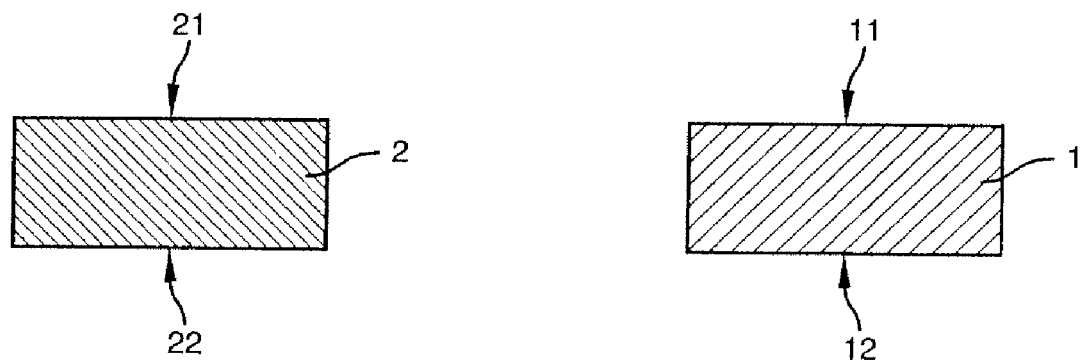
FIGS. 1A to 1C illustrate the various steps of a method of fabricating a hybrid substrate, according to the invention.

The invention provides methods for directly bonding a donor substrate on a receiver substrate. Generally, the term "direct bonding" is used herein to refer to bonding without an intermediate bonding layer, or with an intermediate bonding layer having a thickness less than about 50 nm. Headings are used herein for clarity only and without any intended limitation.

In particular, the present method relates to the direct bonding of two substrates suitable for use in electronics, optics, or optoelectronics, with each substrate comprising a respective front face and surface, with the front face of a first substrate comprising a semiconductor material at, or in proximity to, the surface, This method preferably comprises preparing the substrate surfaces by exposing at least the surface of the first substrate to a temperature from about 900° C. to about 1200° C. in an inert atmosphere for a duration of at least 30 sec; and directly bonding together the front faces of the prepared substrates.

Another embodiment relates to a method for fabricating a hybrid substrate suitable for use in electronics, optics, or optoelectronics, by providing a receiver substrate having a front face and a donor substrate having a front face, the donor substrate comprising a portion for transfer and a remainder portion, the portion for transfer extending over the front face, and wherein the front face of at least one of the substrates comprises a semiconductor material at, or in proximity to, the surface of the front face; preparing the substrates by exposing at least the substrate comprising the semiconductor material to a temperature from about 900° C. to about 1200° C. in an inert atmosphere for a duration of at least 30 sec; directly bonding together the front faces of the prepared substrates; and removing the remainder portion of the donor substrate from the bonded substrates thereby obtaining a hybrid substrate comprising the receiver substrate and the transferred portion of the donor substrate.

In the figures, the receiver substrate 1, donor substrate 2, and bonding interface 3 are shown. The face of the receiver substrate 1 that is to come into contact with the donor substrate 2, the front or bonding face, has reference number 11; the face that is generally parallel to and opposed to the front face, the rear face, has reference number 12. Similarly, the donor substrate 2 has front or bonding face 21, and rear face 22. The donor substrate 2 and the receiver substrate 1 may be single-layer or multilayer substrates.

At least one of the donor or receiver substrates, 2 or 1, comprises a layer of semiconductor material (or a semiconductor layer). Thus, the other substrate can comprise a non-semiconductor material, e.g., an insulating material such as sapphire or other oxide. Semiconductor materials are those that are generally used in the field of microelectronics, namely, for example, (100) silicon, (110) silicon, or (111) silicon (the numerals denoting crystallographic types), germanium, GaAs, GaN, and so forth. A substrate "comprises a layer of semiconductor material (or a semiconductor layer)" if it is a single-layer substrate of the semiconductor material, or if it is a multilayer substrate having at least one layer is of the semiconductor material.

Further, if the substrate is a multilayer substrate, then the layer of semiconductor material (or semiconductor layer) extends along the front face of the substrate or in the proximity thereof. A semiconductor layer "extends along the front face" if it is at the surface of the front face. A semiconductor layer is "in the proximity of the front face" if it either extends along the front face, or is overlain by an insulating surface layer of thickness less than about 50 nm, or less than about 20 nm, or preferably less than about 10 nm. The insulating layer can include oxide layer, which can have a thickness down to less than of a few Å (1 nm=10 Å) in the case of a native oxide layer (which can only a Å few thick). Similarly, a single-layer substrate of semiconductor material may also be covered by a surface insulating layer of similar thickness.

The invention comprises exposing the substrate comprising a semiconductor layer to a selected heat treatment, or if both substrates comprise a semiconductor layer, then exposing both substrates to the heat treatment. Thus, at least one of the faces to be bonded, that is, at least one of the front faces 11 and/or 21, are exposed to the heat treatment. The selected heat treatment is at a temperature between about 900° C. and about 1200° C. in an atmosphere comprising hydrogen gas and/or an inert gas such argon gas or nitrogen gas, but substantially no oxygen gas. For example, the gaseous atmosphere may comprise: exclusively hydrogen; or exclusively an inert gas, preferably argon but also nitrogen or other inert gas; or a mixture of hydrogen and an inert gas; or hydrogen or inert gas associated with another other gas other than oxygen. The selected heat treatment is performed for a duration of at least 30 s, and preferably not more than a few minutes (min), e.g., not more than 1 min, or not more than 5 min, or not more than 10 min.

The hydrogen and/or argon (or inert gas) is believed to eliminate substantially all of any native oxide present on the front face(s), and also to passivate the front face(s) with hydrogen atoms. The hydrogen and/or argon (or inert gas) is also believed to reduce the surface roughness to very small values and to make the treated surfaces hydrophobic. The latter effect has been demonstrated by measuring the contact angle of a drop of water with a treated surface. The result was about 80°, which was considerably greater than the contact angle (typically 70°) after an HF last treatment. See, e.g., Y. Bäcklünd, Karin Hermasson, L. Smith, "Bond-strength measurements related to silicon surface hydrophilicity", *J. Electrochem. Soc.*, Vol. 1398, No. 8, 1992. It is known in that art that the larger the contact angle of drop of water makes with a surface, then the higher is the degree of hydrophobicity of the surface. Thus, surfaces treated according to the invention can be more hydrophobic than surface treated according to an HF last cleaning.

It is further believed that substantially no species except for hydrogen (or, generally, no species capable of causing blisters and similar bonding defects) remains adsorbed on the surface after the selected heat treatment. Hydrogen atoms thus do not generate degassing defects (e.g., blisters), because, since hydrogen atoms are very small, on being desorbed during bonding (e.g., to create covalent bonds between the front faces 11 and 12), they are not trapped at the interface, but instead diffuse into the substrate material.

An advantage of the invention is that is easier to implement than prior methods. The methods of the invention involve only dry treatments, and can be entirely implemented in any chambers that enable the dry selected heat treatment. Such chambers include, for example, single-plate rapid thermal annealing (RTA) type chambers, or epitaxy chambers, or traditional chambers suitable for processing batches of substrates. In contrast, the known methods of hydrophilic or hydrophobic cleaning are more difficult to implement. These methods require wet treatment in cleaning baths with subsequent drying. It has also been observed that bonding faces prepared in according to the invention are much less reactive than are bonding faces prepared by the HF last cleaning. Thus, particle contamination of the bonding faces of the invention is limited such surfaces, which further promotes commercial application of the invention.

After the selected heat treatment, the bonding faces must be quickly brought into intimate contact for bonding in order to minimize any contamination from the ambient atmosphere or other sources. This bonding step is shown in FIGS. 1B, 2B, 3B, and 4B. However, treated substrates can be stored in a chamber having an inert atmosphere, preferably argon or nitrogen or a mixture thereof, in which case it is possible to wait a longer time before the donor and receiver substrates 2 and 1 are bonded together.

Advantageously, after bonding, the bonded substrates can optionally be annealed to reinforce bonding. Such pre-consolidation or consolidation annealing includes exposure to a temperature between about 200° C. and about 1200° C., preferably at least approximately 1100° C. if it is desired to consolidate the interface entirely. The pre-consolidation or consolidation annealing has a duration of preferably at least one about hour but preferably less than about three hours. This pre-consolidation or consolidation heat treatment takes place without bubbles forming, thereby ensuring good bonding energy at all locations of the bonding interface.

The direct bonding methods of the invention can be implemented as part of existing methods of fabricating hybrid substrates. For example, a combined fabrication method might include: selecting a donor substrate 2 and a receiver substrate 1 with the described properties; performing the selected heat treatment and bonding steps as described; and removing a portion of the donor substrate, referred to herein as "the remainder", so as to obtain a hybrid substrate that comprises the receiver substrate 1 with a portion of the donor substrate, referred to herein as the "transferred layer", bonded thereto.

Figure 1B:
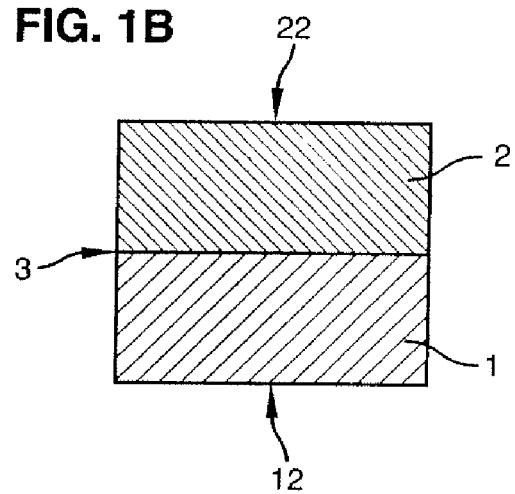
Figure 1C:
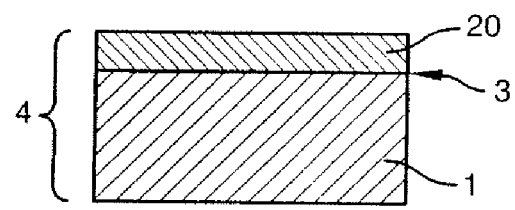

FIGS. 1A to 1C illustrate a preferred embodiment of fabricating hybrid substrate 4 from donor substrate 2 and receiver substrate 1 both of which are single-layer substrates. First, the selected heat treatment (also referred to herein as the "surface treatment") is performed and the substrates are bonded. Next, a portion of the donor substrate, referred to herein as the "remainder", is removed by mechanical thinning such as abrading and polishing so that transferred layer 20 (e.g., the portion of the donor substrate that is not removed) remains bonded to the receiver substrate.

Figure 2A:
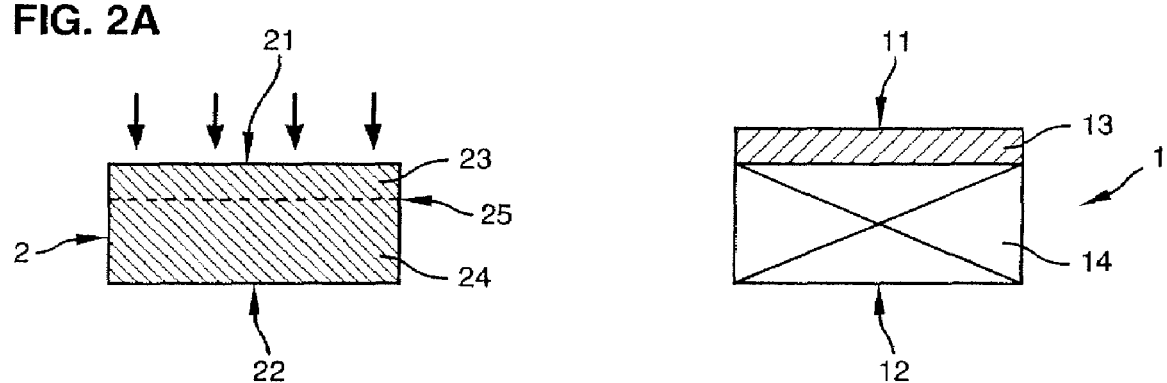
FIGS. 2A to 2C, 3A to 3D, and 4A to 4C illustrate respectively three variant implementations of the invention.
Figure 2B:
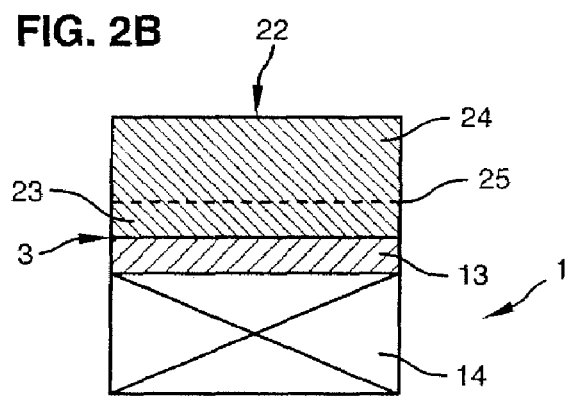
Figure 2C:
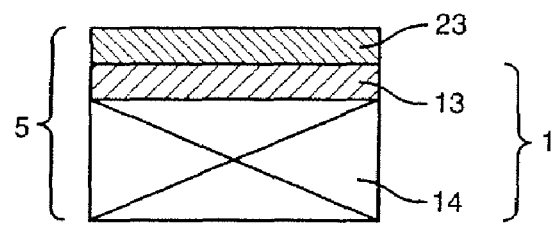

FIGS. 2A to 2C illustrate another preferred embodiment in which donor substrate 2 includes zone of weakness 25, which defines transfer layer 23 and remainder portion 24. Zone of weakness 25 can be formed, e.g., by implanting atomic species, e.g. hydrogen ions, using methods known under the name SMART-CUT®. When so formed, the selected heat treatment cannot be performed on the donor substrate prior to bonding to avoid the risk of causing bubbles at front face 21 (due to the implanted atomic species). The selected heat treatment can only be performed on semiconductor layer 13 which covers the receiver substrate 1 (or, equivalently, extends along the front face of the receiver substrate). Layer 13, e.g. of silicon, may comprise a fine surface layer of native oxide.

After surface treatment and direct bonding of substrates 1 and 2, remainder 24 of the donor substrate 2 is removed by applying mechanical, chemical, and/or thermal stresses in accordance with the techniques commonly used in implementing the SMART-CUT® methods. Resulting hybrid substrate 5, illustrated in FIG. 2, comprises semiconductor layers 13 and 23 of and layer 14 of the donor substrate 1.

Alternatively, zone of weakness 25 could comprise a porous layer fabricated according to methods known under the trademark ELTRAN. Also, donor substrate 2 may optionally be treated using the above-mentioned "HF last" method, or some other technique enabling a hydrophobic or hydrophilic surface to be obtained. The donor substrate can comprise a non-semiconducting layer on its front face.

Figure 3A:
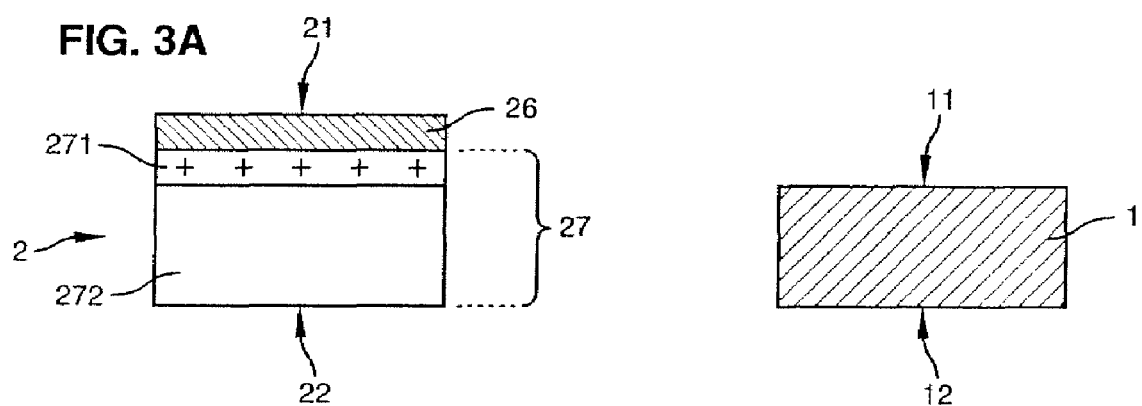
Figure 3B:
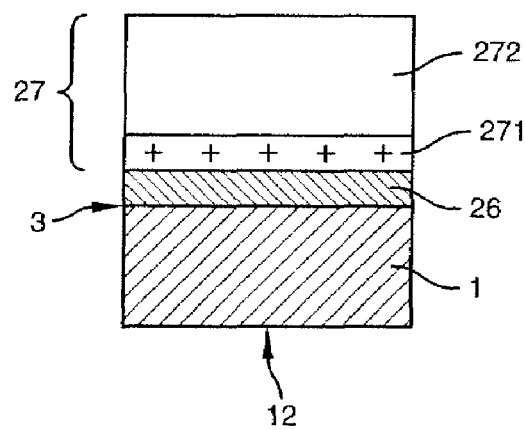
Figure 3C:
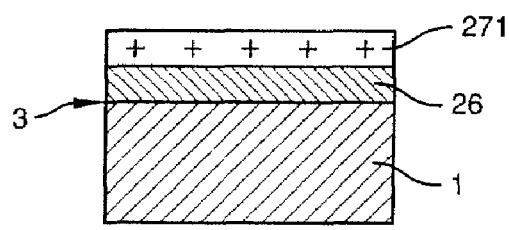
Figure 3D:
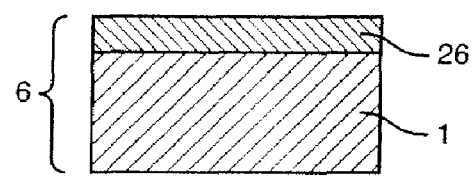

FIGS. 3A to 3C illustrate another preferred embodiment where receiver substrate 1 is similar to that described in connection with FIG. 1A. Donor substrate 2, of semiconductor-on-insulator type, comprises two semiconductor layers 26 and 272 and interposed insulating layer 271. FIG. 3B illustrates the results of the performing the selected heat treatment and bonding according to the invention, Next, remainder 27 of the donor substrate is removed in two stages. The first stage, illustrated in FIG. 3C, comprises mechanically removing layer 272, by abrading and then polishing. The second stage, illustrated in FIG. 3CD comprises removing insulating 271, e.g. by chemical etching. Resulting hybrid substrate 6 comprises transferred layer 26 bonded to receiver substrate 1. Other removal techniques can also be used depending on the nature of the donor substrate 2.

Figure 4A:
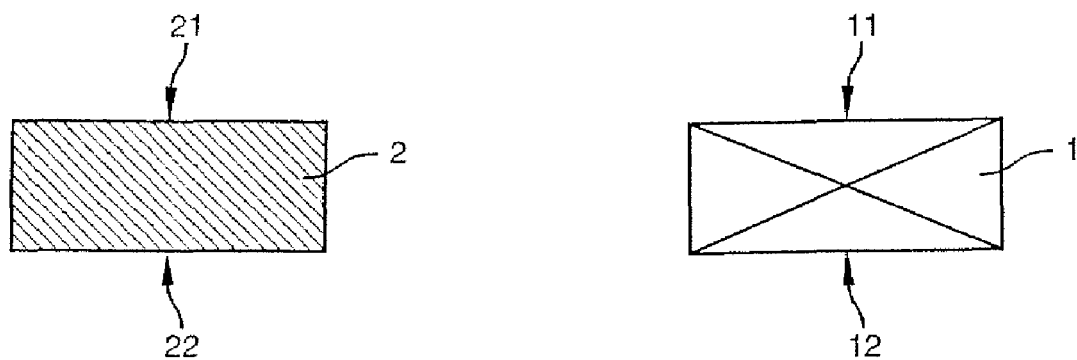
Figure 4B:
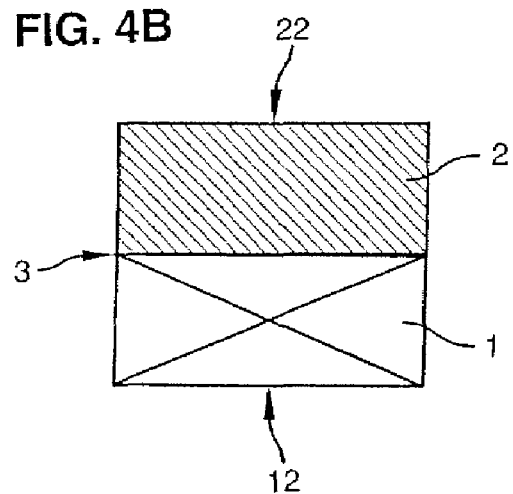
Figure 4C:
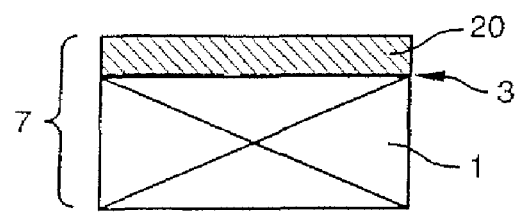

Finally, FIGS. 4A to 4C illustrate another preferred embodiment of the invention. Receiver substrate 1 is a single layer of a non-semiconducting material, while donor substrate 2 is a single layer of a semiconducting material similar to that described in connection with FIG. 1A. The selected heat treatment prior to bonding is, in accordance with the invention, applied only to donor substrate 2 and not to receiver substrate 1. FIG. 4B illustrates that, next, the bonding faces of the two substrates are brought into intimate contact, after which an optional consolidating (i.e., heat treatment) anneal can be performed. FIG. 4C illustrates that the remainder of donor substrate 2 is then removed so that hybrid substrate 7 comprises transferred semiconductor layer 20 bonded to non-semiconducting receiver substrate 1.

In either embodiment, it is helpful for the method to further comprise providing a thin insulating surface layer upon at least part of the surface of the substrate or substrates comprising a semiconductor material.

In alternative embodiments, the bonding faces of the donor and/or the receiver substrates can be subjected to plasma activation treatment for improving bonding strength. Also, if one bonding face was not subject to the selected thermal treatment, conventional hydrophilic or hydrophobic surface treatments, for example treatment of the RCA type, can be applied to that bonding face. In embodiments where the remainder of the donor substrate is detached along a zone of weakness, the resulting free surface after detaching can be slightly damaged. It can be advantageous to subject the final hybrid substrate to finishing by smoothing heat treatment, or by sacrificial oxidation, or by polishing. Further, known cleaning techniques can be applied to the substrates prior to performing of methods of the invention.

EXAMPLES

Non-limiting examples of the invention are described next.

Example 1A

Direct Bonding Silicon Substrates

Donor substrate 2 and receiver substrate 1 were selected to be (100) silicon substrates of 300 millimeter (mm) diameter. The numbers of particles on the front faces of the substrates were measured by a laser surface scanner device (e.g., as sold under the trademark Surfscan SP1 by supplier KLA-Tencor) both before and after the following preparation. After the first particle measurement, both substrates were prepared according to the invention as follows: first, cleaning in baths of ozone and SC1 solution and rinsing in deionized water, and second, performing the selected heat treatment at a temperature of 1060° C. for a duration of 3 min in an atmosphere containing 100% hydrogen. After this preparation, the second particle measurement revealed that fewer than 50 additional particles with a size of 0.13 µm were on the substrate surfaces.

Next, the front faces of the donor and receiver substrates were brought into intimate contact and directly bonded, and the bonded substrates were subject to a consolidating anneal at a temperature about 1100° C. for about 2 hours. After bonding and annealing, bond quality was measured by acoustic microscopy, and no bonding defects were detected.

Example 1B

A Prior Art Method

Silicon substrates were prepared as in Example 1A, except that, instead of performing the selected heat treatment, "HF last" treatment was performed according to the prior art. After this preparation, more than 800 additional particles were found on the substrate surfaces.

Next, the donor and receiver substrates were directly bonding and annealed as in Example 1A. Bond quality was measured by acoustic microscopy, and bonding defects were detected.

Comparison of Examples 1A and 1B demonstrate that bonds formed according to the invention have a higher quality than bonds formed according to the prior art.

Example 2

Analysis of Hydrophobic Bonding after Various Types of Pre-Consolidation or Consolidation Thermal Annealing Four pairs of silicon substrates were bonded as described in Example 1A, except that four different consolidating heat treatments (also referred to as "(thermal) annealing") were performed.

a) a single step with temperature/duration of 200° C./2 h;

b) a first step with temperature/duration of 350° C./2 h; then a temperature ramp-up to 500° C. at 5° C./min; then a second step with temperature/duration of 500° C./1 h;

c) a first step with temperature/duration of 350° C./2 h; then a temperature ramp-up to 700° C. at 5° C./min; then a second step with temperature/duration of 700° C./1 h; and d) a first annealing step with temperature/duration of 350° C./2 h; then a temperature ramp-up to 900° C. at 5° C./min; then a second step with temperature/duration of 900° C./1 h.

Bonds between the substrates were observed using an acoustic microscopic both before and after the thermal annealing step(s). No bubbles were observed either before or after any of the four annealing steps.

Next, four more pairs of silicon were bonded and annealed as above, except that the selected heat treatment was at about 1100° C. for 60 s in an atmosphere of 20% hydrogen and 80% oxygen. Again, no bubbles were observed either before or after any of the four annealing steps.

Example 3

SOI-Type Donor Wafers

Four SOI-type donor substrates each including a silicon surface layer, an oxide intermediate layer, and a silicon support layer were bonded to four receiver substrates after a selected heat treatment as described in Example 1. Then, the silicon support layers of the donor wafers were removed by polishing and applying tetramethylammonium hydroxide (TMAH), and the oxide intermediate layers of the donor wafers were removed by chemical etching using hydrofluoric acid (HF). Accordingly, the four hybrid substrates included the silicon surface layers originating from the SOI-type donor wafers bonded to the receiver substrates.

Next, the four hybrid wafers were subject to the four consolidating annealing described in Example 2. Again, no bubbles were observed either before or after any of the four annealing steps.

Example 4

Substrate with a Zone of Weakness

Silicon donor substrates were selected with a surface native oxide layer a few nanometers thick or a deposited oxide less than 50 nm thick. They were prepared by implanting hydrogen ions at a density of $5 \times 10^{16}$ $H^+/cm^2$ with an energy of 60 kiloelectron volts (keV), thus creating a zone of weakness. These donor substrates were not subjected to the selected heat treatment (to avoid splitting at the zone of weakness). However, silicon receiver substrates were subjected to the selected heat treatment in accordance with the invention.

Next, the front faces of the donor and receiver substrates were directly bonded, and the bonded substrates were then subjected to pre-consolidation annealing at about 200° C. Finally, the remainder of the donor substrate was detached along the zone of weakness by applying thermal stresses, e.g., treatment at a temperature of about 400° C. to about 600° C. for a duration of about 2 h to about 8 h. The final substrate was then subjected to a finishing step by smoothing heat treatment, by sacrificial oxidation, and/or by polishing.

Bond quality was then measured by acoustic microscopy, and no bonding defects, e.g., no bubbles, were detected.

The preferred embodiments of the invention described above do not limit the scope of the invention, since these embodiments are illustrations of several preferred aspects of the invention. Any equivalent embodiments are intended to be within the scope of this invention. Indeed, various modifications of the invention in addition to those shown and described herein, such as alternate useful combinations of the elements described, will become apparent to those skilled in the art from the subsequent description. Such modifications are also intended to fall within the scope of the appended claims. In the following (and in the application as a whole), headings and legends are used for clarity and convenience only.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments. Other embodiments will occur to those skilled in the art and are within the following claims.

A number of references are cited herein, the entire disclosures of which are incorporated herein, in their entirety, by reference for all purposes. Further, none of the cited references, regardless of how characterized above, is admitted as prior to the invention of the subject matter claimed herein.

What is claimed is:

1. A method of direct bonding two substrates suitable for use in electronics, optics, or optoelectronics, each substrate comprising a respective front face and surface, with the front face of a first substrate comprising a semiconductor material at, or in proximity to, the surface, wherein the method comprises:
    preparing the substrate surfaces by exposing at least the front face of the first substrate to a temperature from 900° C. to about 1200° C. in an inert atmosphere for a duration of at least 30 sec to provide a hydrophobic surface that is substantially free of a native oxide; and directly bonding together the front faces of the substrates.

2. The method of claim 1 wherein the front faces of both substrates comprise semiconductor materials, and wherein the preparing further comprises preparing both substrates by the recited temperature exposure.

3. The method of claim 1 which further comprises providing a thin insulating surface layer upon at least part of the surface of the first substrate.

4. The method of claim 1 wherein at least part of the semiconductor material of the first substrate is exposed at the surface.

5. The method of claim 1 wherein the inert atmosphere comprises one or more of nitrogen, argon, and hydrogen.

6. The method of claim 1 wherein the inert atmosphere consists essentially of argon.

7. The method of claim 1 wherein the inert atmosphere consists essentially of hydrogen.

8. The method of claim 1 which further comprises, prior to bonding, storing temporarily the prepared substrates in an inert atmosphere.

9. The method of claim 1 which further comprises, subsequent to bonding, performing a bonding consolidation heat treatment by exposing the bonded substrates to a temperature in the range of about 200° C. to about 1200° C.

10. The method of claim 9 where the consolidation heat treatment is performed for a duration of at least about one hour or for a duration of less than about three hours.

11. The method of claim 1 wherein the semiconductor material comprises one or more of (100) silicon, (110) silicon, and (111) silicon.

12. A method of fabricating a hybrid substrate suitable for use in electronics, optics, or optoelectronics comprising:
    providing a receiver substrate having a front face and a donor substrate having a front face, the donor substrate comprising a portion for transfer and a remainder portion, the portion for transfer extending over the front face, and wherein the front face of at least one of the substrates comprises a semiconductor material at, or in proximity to, the surface of the front face;
    preparing the substrates by exposing at least the substrate comprising the semiconductor material to a temperature from 900° C. to about 1200° C. in an inert atmosphere for a duration of at least 30 sec to provide a hydrophobic surface that is substantially free of a native oxide;
    directly bonding together the front faces of the substrates; and removing the remainder portion of the donor substrate from the bonded substrates thereby obtaining a hybrid substrate comprising the receiver substrate and the transferred portion of the donor substrate.

13. The method of claim 12 which further comprises providing a thin insulating surface layer upon at least part of the surface of the substrate or substrates comprising a semiconductor material.

14. The method of claim 13 wherein the insulating surface layer has a thickness less than or equal to about 50 nm.

15. The method of claim 12 wherein the removing further comprises mechanical or chemical thinning.

16. The method of claim 12 which further comprises, prior to bonding, forming a zone of weakness in the donor substrate, and wherein at least a portion of the remainder of the donor substrate is removed along the zone of weakness.

17. The method of claim 16 wherein the receiver substrate comprises a layer of semiconductor material, and wherein forming the zone of weakness further comprises implanting atomic species into the donor substrate, and wherein only the surface of the receiver substrate is prepared.

18. The method of claim 16 wherein the zone of weakness comprises a porous zone.

* * * * *

UNITED STATES PATENT AND TRADEMARK OFFICE
CERTIFICATE OF CORRECTION

PATENT NO. : 7,670,929 B2  Page 1 of 1
APPLICATION NO. : 11/624070
DATED : March 2, 2010
INVENTOR(S) : Bourdelle et al.

It is certified that error appears in the above-identified patent and that said Letters Patent is hereby corrected as shown below:

Title Page:
Item (75) Inventors: change the city of residence of Konstantin Bourdelle from "Crolle" to -- Crolles --; and change the first name of legal representative "Giséle" Rayssac to -- Gisèle --.
Item (73) Assignee: change "S.O.I. Tec" to -- S.O.I.Tec --.
Item (56) References Cited, FOREIGN PATENT DOCUMENTS: after "EP 0 335 741 B1", change "8/1995" to -- 10/1998 --.
Item (56) References Cited, OTHER PUBLICATIONS:
R. Esser, et al. reference, change "Si-Si hydrophilic" to -- hydrophobic Si-Si --.
R.D. Horning et al. reference, before "pp. 199-206", insert -- Second International Symposium on Semi-Conductor Wafer Bonding, (1993) 93-29, --.
M.J. Kim et al. reference, before "Materials, vol.", change "Electrochemical" to -- Electronic --.
K.L. Saenger et al. reference, before "for changing the orientation", change "mehod" to -- method --.
C.Y. Sung et al. reference, after "Tech. Dig. - Int. Electron Devices Meet., 2005", change "236" to -- 225-228 --.
Q.Y. Tong et al., before "(1999)", change "1-99" to -- 1-15 and 80-99 --.
C. Mailville et al. reference, change "Mailville" to -- Maleville --.
Office Action from KIPO reference, after "May 26, 2009", insert -- application no. KR 10-2007-0069696 --.
Taekryong Chung et al. reference, before "Bonding", delete "Direct".

Signed and Sealed this

Twenty-seventh Day of April, 2010

David J. Kappos
*Director of the United States Patent and Trademark Office*